(12) United States Patent
Nakazawa

(10) Patent No.: US 12,506,042 B2
(45) Date of Patent: Dec. 23, 2025

(54) HEADER FOR SEMICONDUCTOR PACKAGE

(71) Applicant: SHINKO ELECTRIC INDUSTRIES CO., LTD., Nagano (JP)

(72) Inventor: Katsuya Nakazawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 517 days.

(21) Appl. No.: 18/053,457

(22) Filed: Nov. 8, 2022

(65) Prior Publication Data

US 2023/0154818 A1    May 18, 2023

(30) Foreign Application Priority Data

Nov. 17, 2021    (JP) ................. 2021-187285

(51) Int. Cl.
| | |
|---|---|
| *H01L 23/045* | (2006.01) |
| *H01L 23/06* | (2006.01) |
| *H01L 23/10* | (2006.01) |
| *H01L 23/367* | (2006.01) |
| *H01L 23/373* | (2006.01) |

(Continued)

(52) U.S. Cl.
CPC ........ *H01L 23/367* (2013.01); *H01L 23/3736* (2013.01); *H01L 23/4922* (2013.01); *H01S 5/02315* (2021.01)

(58) Field of Classification Search
CPC ............... H01L 23/367; H01L 23/3736; H01L 23/4922; H01L 24/66; H01L 24/00; H01L 2924/19107; H01L 2924/3011; H01L 23/045; H01L 23/06; H01L 23/10; H01L 23/3675; H01S 5/02315

See application file for complete search history.

(56) References Cited

U.S. PATENT DOCUMENTS

| | | | |
|---|---|---|---|
| 2009/0161712 A1 | 6/2009 | Hayami et al. | |
| 2016/0020577 A1* | 1/2016 | Sakai | ............... H01S 5/02212 |
| | | | 362/382 |

(Continued)

FOREIGN PATENT DOCUMENTS

| | | |
|---|---|---|
| EP | 2256880 | 12/2010 |
| JP | 10125996 A * | 5/1998 |

(Continued)

OTHER PUBLICATIONS

Extended European Search Report mailed on Apr. 25, 2023 with respect to the corresponding European patent application No. 22206548.4.

*Primary Examiner* — Dale E Page
*Assistant Examiner* — Cristian A Tivarus
(74) *Attorney, Agent, or Firm* — IPUSA, PLLC

(57) ABSTRACT

A header for a semiconductor package, includes an eyelet having a first surface, a second surface opposite to the first surface, a side surface, and a through hole penetrating the eyelet from the first surface to the second surface, a lead inserted through the through hole, and a metal base bonded to the second surface of the eyelet. The lead is bent at the second surface of the eyelet and protrudes from the side surface of the eyelet in a plan view. The metal base is spaced apart from the lead. The lead, located at a position overlapping the eyelet in the plan view, is disposed within a thickness range of the metal base in a side view.

13 Claims, 6 Drawing Sheets

(51) Int. Cl.
 H01L 23/492 (2006.01)
 H01S 5/02315 (2021.01)

(56) References Cited

U.S. PATENT DOCUMENTS

2017/0229841 A1* 8/2017 Hettler ................ H01S 5/02251
2020/0227887 A1* 7/2020 Katayama ........... H01S 5/02212

FOREIGN PATENT DOCUMENTS

| JP | 2004-235212 | | 8/2004 |
| JP | 2008-034640 | | 2/2008 |
| JP | 4678154 | B2 * | 4/2011 |
| JP | 2017017146 | A * | 1/2017 |

* cited by examiner

HEADER FOR SEMICONDUCTOR PACKAGE

CROSS-REFERENCE TO RELATED APPLICATIONS

This application is based upon and claims priority to Japanese Patent Application No. 2021-187285, filed on Nov. 17, 2021, the entire contents of which are incorporated herein by reference.

FIELD

Certain aspects of the embodiments discussed herein are related to headers for semiconductor packages.

BACKGROUND

A header for a semiconductor package may be mounted with a semiconductor device, such as a light emitting element, for example. A known configuration of the header may include a disk shaped eyelet, and a metal block protruding from an upper surface of the disk shaped eyelet, for example. The metal block includes a surface forming a device mounting surface on which the semiconductor device is to be mounted. The eyelet is provided with a plurality of through holes to be inserted with leads, and the leads are sealed inside the through holes by a sealer, such as glass or the like.

An example of the header for the semiconductor device is proposed in Japanese Laid-Open Patent Publication No. 2004-235212, for example.

In the header for the semiconductor package described above, the leads penetrate the eyelet and protrude from a lower surface of the eyelet, to thereby extend in a direction perpendicular to the lower surface of the eyelet. For this reason, when a heat sink, such as a heat spreader or the like, is disposed on the lower surface of the eyelet, it is necessary to provide a hole for inserting the lead in the heat spreader or the like. Accordingly, it is not easy to dispose the heat sink on the lower surface of the eyelet.

SUMMARY

Accordingly, it is an object in one aspect of the embodiments to provide a header for a semiconductor package that enables a heat sink to be easily disposed on a lower surface of an eyelet.

According to one aspect of the embodiments, a header for a semiconductor package includes an eyelet having a first surface, a second surface opposite to the first surface, a side surface, and a first through hole penetrating the eyelet from the first surface to the second surface; a lead inserted through the first through hole; and a metal base bonded to the second surface of the eyelet, wherein the lead is bent at the second surface of the eyelet and protrudes from the side surface of the eyelet in a plan view, the metal base is spaced apart from the lead, and the lead, located at a position overlapping the eyelet in the plan view, is disposed within a thickness range of the metal base in a side view.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
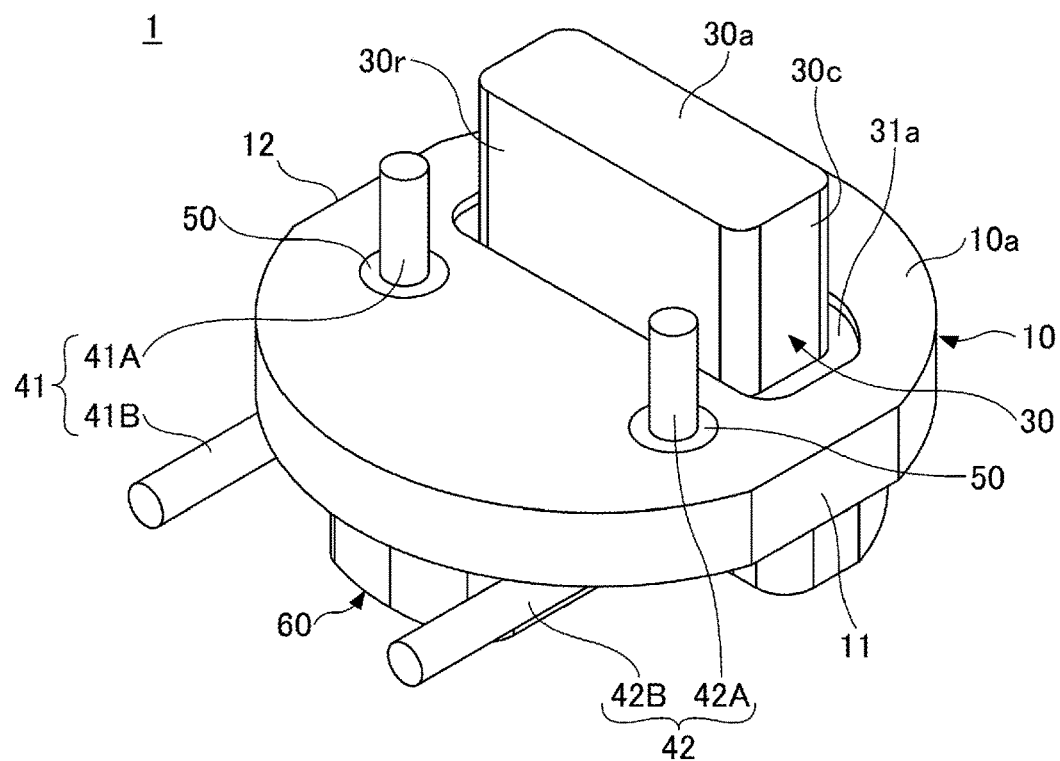
FIG. 1A and FIG. 1B are perspective views illustrating an example of a header for a semiconductor package according to a first embodiment.

Preferred embodiments of the present invention will be described with reference to the accompanying drawings. In the drawings, those parts that are the same are designated by the same reference numerals, and a repeated description of the same parts may be omitted.

First Embodiment

Figure 1B:
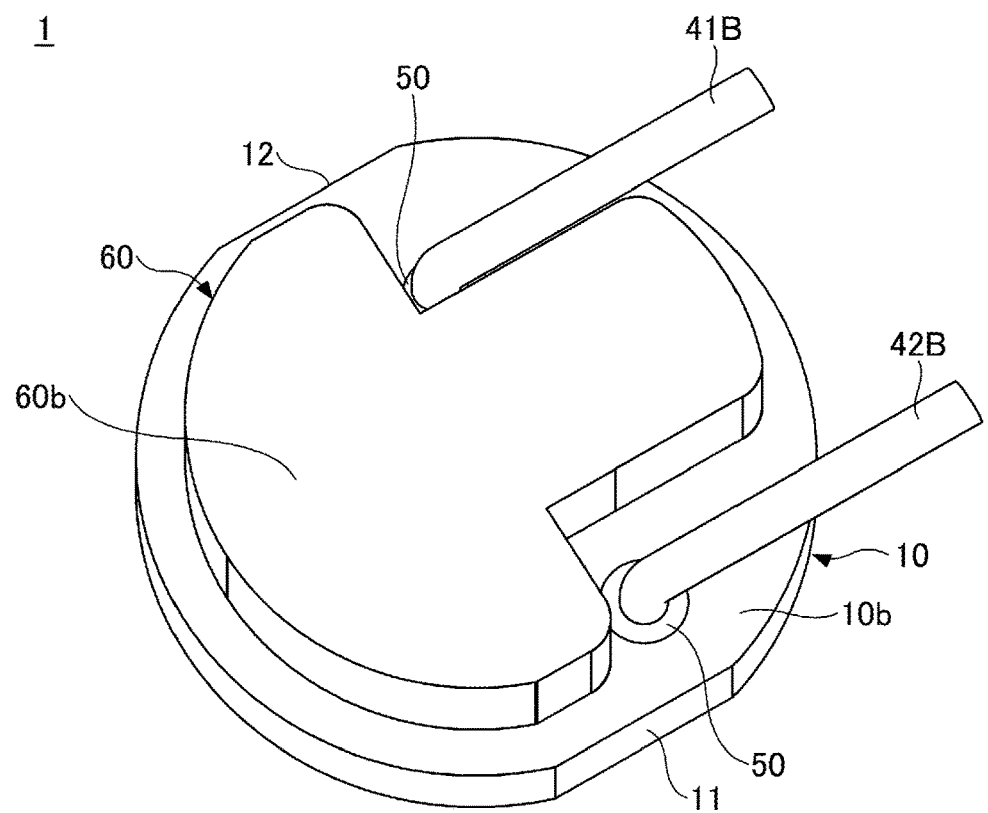
Figure 2A:
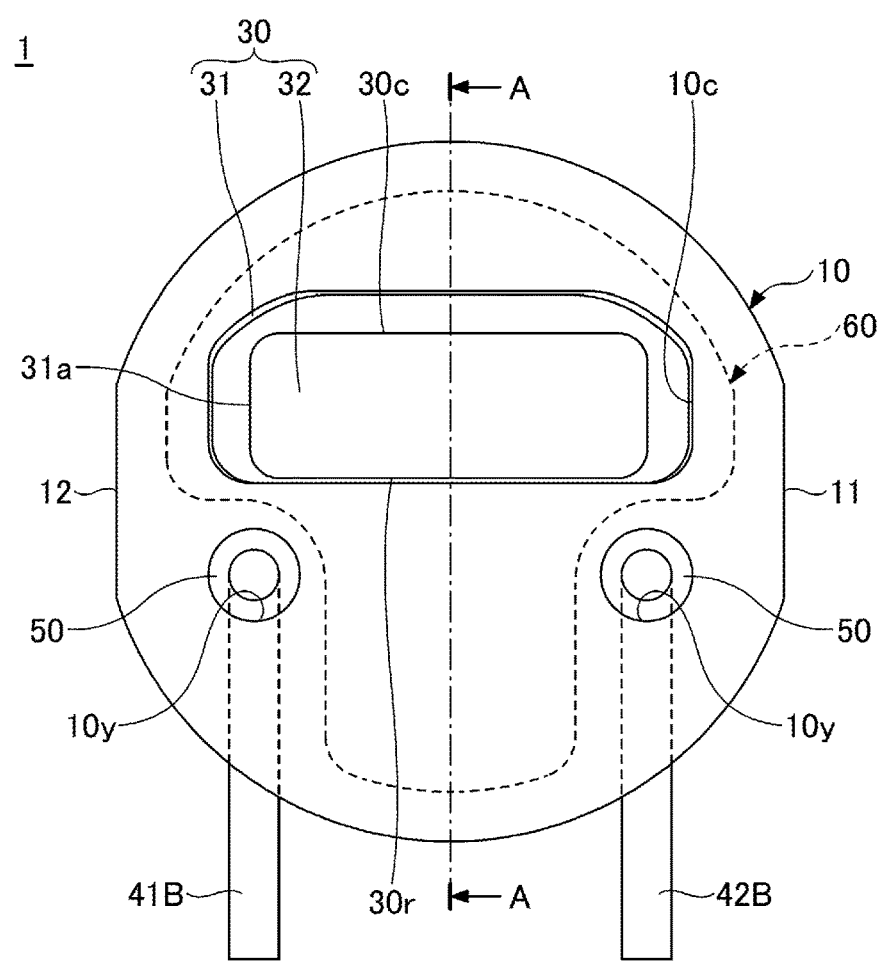
FIG. 2A and FIG. 2B are diagrams illustrating the example of the header for the semiconductor package according to the first embodiment.
Figure 2B:
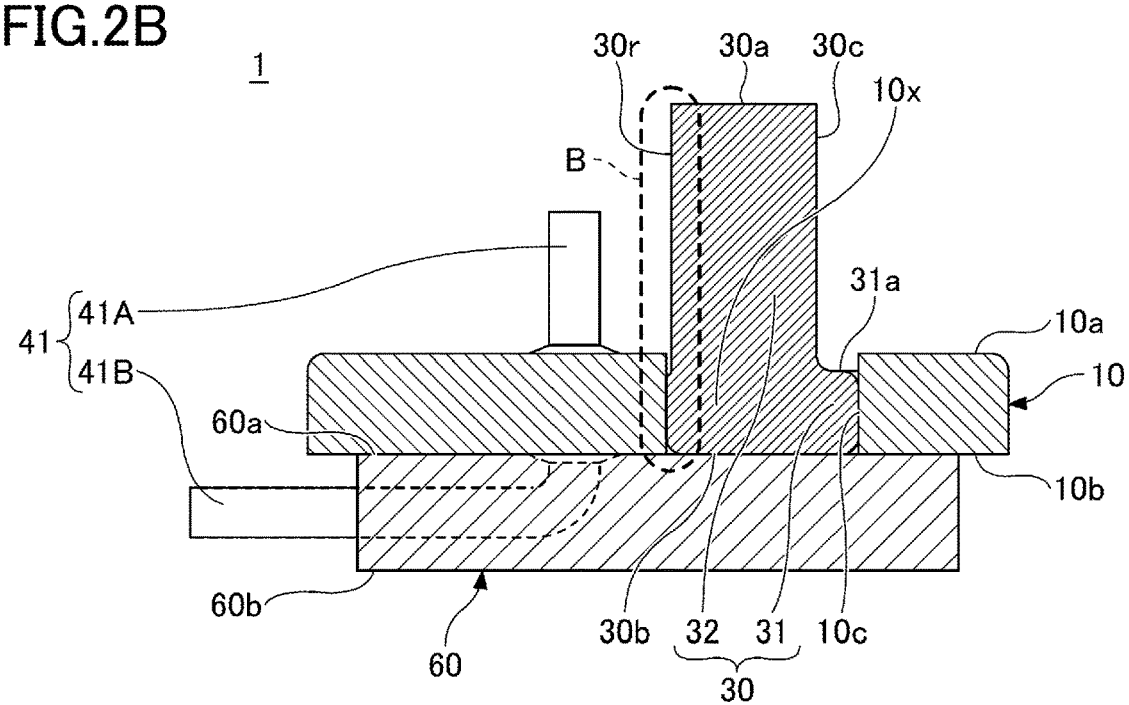

FIG. 1A and FIG. 1B are perspective views illustrating an example of a header for a semiconductor package according to a first embodiment. FIG. 1A is the perspective view viewed from above, and FIG. 1B is the perspective view viewed from below. FIG. 2A and FIG. 2B are diagrams illustrating the example of the header for the semiconductor package according to the first embodiment. FIG. 2A is a plan view, and FIG. 2B is a cross sectional view along a line A-A in FIG. 2A.

As illustrated in FIG. 1A through FIG. 2B, a header 1 for the semiconductor package (hereinafter also referred to as a "semiconductor package header 1") according to the first embodiment includes an eyelet 10, a metal block 30, a first lead 41, a second lead 42, a sealer 50, and a metal base 60.

The eyelet 10 is a disk-shaped member. In the present specification, the term "disk-shaped member" refers to a member having an approximately circular planar shape and a predetermined thickness. The predetermined thickness relative to the diameter of the disk-shaped member is not particularly limited. In addition, the disk-shaped member may partially include a portion formed with a recess, a protrusion, a through hole, or the like.

Moreover, in the present specification, a plan view of an object refers to a view of the object from above the object, viewed in a normal direction to an upper surface 10a of the eyelet 10, and a planar shape of the object refers to the shape of the object in the plan view viewed in the normal direction to the upper surface 10a of the eyelet 10. Further, in the present specification, the terms "parallel", "perpendicular", and "right angle" can tolerate a difference within +5 degrees, unless specifically referred to as being perfectly (or exactly) "parallel", "perpendicular", and "right angle".

Cutouts 11 and 12, that are flat surfaces on opposite ends, may be formed on a side surface of the eyelet 10. The cutouts 11 and 12 may be used for positioning a device mounting surface or the like when the semiconductor package header 1 is mounted with a semiconductor device, for example. The cutouts 11 and 12 may be used for positioning the semiconductor package header 1 in a rotating direction. The cutouts 11 and 12 may be provided, as required.

A diameter of the eyelets 10 is not particularly limited, and may be determined appropriately according to needs or purpose. The diameter of the eyelet 10 may be 5.6 mm (ø5.6 mm), 9.0 mm (ø9.0 mm), or the like, for example. The thickness of the eyelet 10 is not particularly limited, and may be determined appropriately according to the needs or purpose. The thickness of the eyelet 10 may be in a range of approximately 0.5 mm to approximately 3 mm, for example.

The eyelet 10 can be formed of a metallic material, such as iron, stainless steel, or the like, for example. The eyelet 10 may be formed of a metallic material (for example, a so-called cladding material) in which multiple metal layers (copper layers, iron layers, or the like) are laminated. A surface of the eyelet 10 may be plated. The plating provided on the surface of the eyelet 10 may be gold plating, for example.

A through hole 10x formed in the eyelet 10 penetrates from the upper surface 10a to the lower surface 10b of the eyelet 10. A first end of the metal block 30 is inserted into the through hole 10x provided in the eyelet 10, and a second end of the metal block 30, opposite to the first end, protrudes from the upper surface 10a of the eyelet 10. In the present embodiment, the metal block 30 includes a pedestal 31, and a columnar part 32 protruding from an upper surface 31a of the pedestal 31, for example. The pedestal 31 and the columnar part 32 are integrally formed. The columnar part 32 includes a device mounting surface 30r on which a semiconductor device (for example, a light emitting element, such as a laser or the like) is to be mounted. The device mounting surface 30r is provided so as to be perpendicular to the upper surface 10a of the eyelet 10. The upper surface 31a of the pedestal 31 is not limited to a flat surface.

The first end of the metal block 30 is bonded to the metal base 60. In the present embodiment, the pedestal 31 is inserted into the through hole 10x of the eyelet 10, and the lower surface of the pedestal 31 (that is, a lower surface 30b of the metal block 30) is bonded to the metal base 60, for example. The columnar part 32 includes a portion protruding from the upper surface 10a of the eyelet 10. A large portion of the columnar part 32 protrudes from the upper surface 10a of the eyelet 10. The entire columnar part 32 may protrude from the upper surface 10a of the eyelet 10, however, a portion of the columnar part 32 at the pedestal 31 is preferably located inside the through hole 10x. The lower surface 30b of the metal block 30 approximately coincides with the lower surface 10b of the eyelet 10, for example.

In the plan view, an outer periphery of the upper surface 31a of the pedestal 31 is exposed around the columnar part 32. At the outer periphery of the upper surface 31a of the pedestal 31 exposed around the columnar part 32, a width of the upper surface 31a at the device mounting surface 30r is narrower than the width of the upper surface 31a at surfaces other than the device mounting surface 30r. In other words, in the plan view, a center of the columnar part 32 is offset with respect to a center of the pedestal 31 along a direction of a line A-A toward the first lead 41 and second lead 42. At the outer periphery of the upper surface 31a of the pedestal 31 exposed around the columnar part 32, the width of the upper surface 31a at the device mounting surface 30r may be approximately 0.05 mm, and the width of the upper surface 31a at the surfaces other than the device mounting surface 30r may be approximately 0.5 mm, for example. Such a shape of the columnar part 32 can positively secure a sufficiently large area to dispose the first lead 41 and the second lead 42 in the eyelet 10.

In the plan view, the pedestal 31 has a generally rectangular shape, but corners at both ends of a first side of the pedestal 31 at the device mounting surface 30r (on the side of the first lead 41 and the second lead 42) are rounded, and corners at both ends of a second side of the pedestal 31, opposing the first side, are rounded with a radius larger than that of the corners at both ends of the first side. Such a shape of the pedestal 31 facilitates the arrangement of the pedestal 31 along the shape of the eyelet 10.

In the plan view, the columnar part 32 has a generally rectangular shape, but corners at both ends of a first side of the columnar part 32 at the device mounting surface 30r are rounded, and corners at both ends of a second side opposing the first side are rounded to the same extent as the corners at both ends of the first side. The columnar part 32 is a part for mounting and fixing the semiconductor device when the semiconductor package header 1 is used as a semiconductor package mounted with the semiconductor device, and also functions as a heat sink for dissipating heat generated from the semiconductor device. Such a shape of the columnar part 32 described above can secure a sufficiently large volume of the columnar part 32, and improve the heat dissipation.

A distance between the upper surface 30a of the metal block 30 and the upper surface 10a of the eyelet 10, that is, a protruding distance of the columnar part 32 from the upper surface 10a of the eyelet 10, may be in a range of approximately 3 mm to approximately 4 mm, for example. A material having a higher thermal conductivity than the eyelet 10 may be used for the metal block 30. If the material used for the eyelet 10 is iron, the material used for the metal block 30 may be copper, for example.

Figure 3:
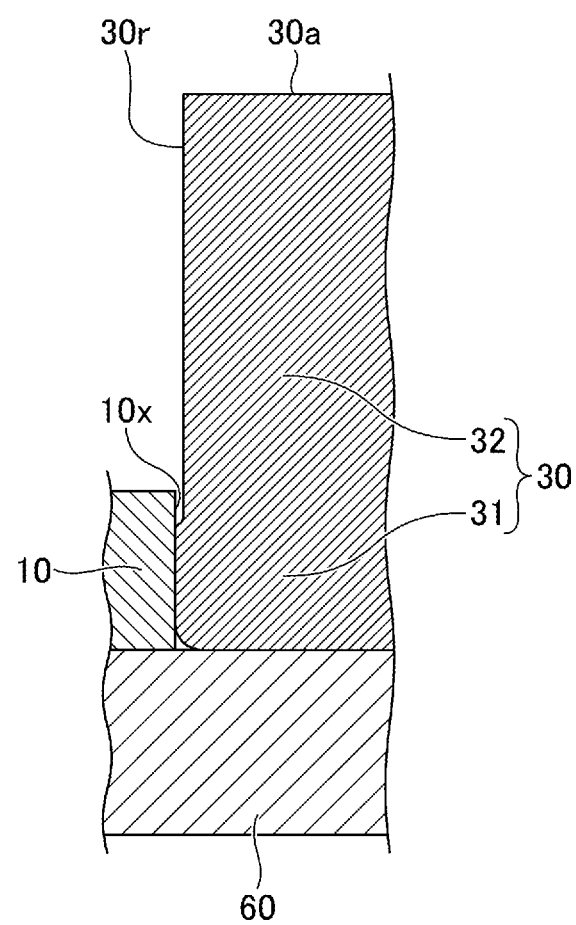
FIG. 3 is a partially enlarged cross sectional view of a part B illustrated in FIG. 2B.

FIG. 3 is a cross sectional view, on an enlarged scale, illustrating a portion of a part B illustrated in FIG. 2B. As illustrated in FIG. 3, a portion of the device mounting surface 30r is preferably located inside the through hole 10x. Due to reasons during the process of forming (or preparing) the metal block 30, the rollover occurs in a rollover region at the pedestal 31 of the device mounting surface 30r. The term "rollover" refers to a rounded edge that is made in an area of a material next to an edge of a die by yielding in the direction of the applied force when the material is forged in the die. The rollover region becomes rounded and does not become flat. Because a portion of the device mounting surface 30r is located inside the through hole 10x, the rollover region of the device mounting surface 30r can be inserted into the through hole 10x. Preferably, the entire rollover region of the device mounting surface 30r is located inside the through hole 10x. In this case, it is possible to increases an area of a flat region of the device mounting surface 30r at the portion protruding from the upper surface 10a of the eyelet 10. As a result, it is possible to mount relatively large devices.

Referring back to FIG. 1A through FIG. 2B, two through holes 10y formed in the eyelet 10 penetrate from the upper surface 10a to the lower surface 10b of the eyelet 10. The first lead 41 and the second lead 42 are inserted into the two different through holes 10y, respectively. The first lead 41 and the second lead 42 may be inserted into a single through hole 10y in a state insulated from each other. The first lead 41 and the second lead 42 are bent at the lower surface 10b of the eyelet 10, and protrude from the side surface of the eyelet 10 in the plan view. Diameters of the first lead 41 and the second lead 42 may be in a range of approximately 0.3 mm to approximately 1 mm, for example.

The first lead 41 has a first part 41A penetrating the eyelet 10, and a second part 41B continuous with the first part 41A and parallel to the lower surface 10b of the eyelet 10. Similarly, the second lead 42 has a first part 42A penetrating the eyelet 10, and a second part 42B continuous with the first part 42A and parallel to the lower surface 10b of the eyelet 10.

The first part 41A of the first lead 41 is inserted into the through hole 10y penetrating the eyelet 10 from the upper surface 10a to the lower surface 10b, so as to be perpendicular to the upper surface 10a of the eyelet 10. Similarly, the first part 42A of the second lead 42 is inserted into the through hole 10y penetrating the eyelet 10 in a thickness direction, so as to be perpendicular to the upper surface 10a of the eyelet 10. Inside the through holes 10y of the eyelet 10, peripheries of the first part 41A of the first lead 41, and peripheries of the first part 42A of the second lead 42, are sealed by the sealer 50.

In the first lead 41, an angle formed by the first part 41A and the second part 41B is at a right angle, for example. In the second lead 42, an angle formed by the first part 42A and the second part 42B is at a right angle, for example. The second part 41B of the first lead 41 and the second part 42B of the second lead 42 are parallel to each other, for example. However, the second part 41B of the first lead 41 may be non-parallel to the second part 42B of the second lead 42.

The first part 41A of the first lead 41 is parallel to the first part 42A of the second lead 42, for example. Portions of the first part 41A of the first lead 41 and the first part 42A of the second lead 42 protrude from the upper surface 10a and the lower surface 10b of the eyelet 10. In the first part 41A of the first lead 41 and the first part 42A of the second lead 42, an amount of protrusion of the portions protruding from the upper surface 10a of the eyelet 10 is in a range of approximately 1 mm to approximately 3 mm, for example. In the first part 41A of the first lead 41 and the first part 42A of the second lead 42, an amount of protrusion of the portions protruding from the lower surface 10b of the eyelet 10 is in a range of approximately 0.5 mm to approximately 1.5 mm, for example.

Portions of the second part 41B of the first lead 41 and the second part 42B of the second lead 42 protrude from the side surface of the eyelet 10 in the plan view. In the second part 41B of the first lead 41 and the second part 42B of the second lead 42, an amount of protrusion of the portions protruding from the side surface of the eyelet 10 in the plan view is in a range of approximately 1 mm to approximately 3 mm, for example. However, in the second part 41B of the first lead 41 and the second part 42B of the second lead 42, the amount of protrusion of the portions protruding from the side surface of the eyelet 10 in the plan view may be varied appropriately according to usage. The usage includes a case where the first lead 41 and the second lead 42 are inserted into a socket, a case where wires are soldered onto the first lead 41 and the second lead 42, or the like.

The first lead 41 and the second lead 42 are formed of a metallic material, such as a 50% iron-nickel alloy, Kovar, or the like, for example. The sealer 50 is formed of an insulating material, such as a glass material or the like, for example. The first lead 41 and the second lead 42 are electrically connected to a semiconductor device mounted on the semiconductor package header 1, for example. The number of leads may be increased or decreased according to the specification of the semiconductor device to be mounted on the semiconductor package header 1.

The metal base 60 is bonded to the lower surface 10b of the eyelet 10, so as to cover and close one end of the through hole 10x. For example, in the plan view, an outer contour of the metal base 60 is smaller than an outer contour of the eyelet 10, and the metal base 60 does not have a portion that protrudes from the outer contour of the eyelet 10. The metal base 60 is spaced apart from the first lead 41 and the second lead 42. That is, the metal base 60 is not provided at portions where the first lead 41 and the second lead 42 pass through. In other words, the metal base 60 does not have the through holes 10y for receiving the first lead 41 and the second lead 42 to pass through.

The first lead 41 and the second lead 42 located at the positions overlapping the eyelet 10 in the plan view, are disposed within a thickness range of the metal base 60 in a side view. That is, the first lead 41 and the second lead 42 located at the positions overlapping the eyelet 10 in the plan view, are disposed closer to the eyelet 10 than to a lower surface 60b of the metal base 60 in the side view. The side view of an object refers to a view of the object viewed in a direction strictly parallel to the upper surface 10a of the eyelet 10.

Portions of the first lead 41 and the second lead 42 that do not overlap the eyelet 10 in the plan view, may be located below the lower surface 60b of the metal base 60 in the side view. For example, portions of the first lead 41 and the second lead 42 protruding from the side surface of the eyelet 10 in the plan view, may be located below the lower surface 60b of the metal base 60.

A thickness of the metal base 60 can be appropriately determined within a range thicker than the diameters of the first lead 41 and the second lead 42, and can be set in a range of approximately 0.5 mm to approximately 3 mm, for example. The thickness of the metal base 60 may be greater or smaller than the thickness of the eyelet 10. A thermal conductivity of the metal base 60 is higher than or equal to a thermal conductivity of the eyelet 10. For example, in a case where the material used for the eyelet 10 is iron, the material used for the metal base 60 may be copper having higher thermal conductivity than that of the eyelet 10. In this case, it is possible to improve a heat dissipation performance of the semiconductor package header 1.

In the case where the material used for the metal base 60 is copper, the metal base 60 is preferably not disposed at the outer periphery of the lower surface 10b of the eyelet 10. In other words, the outer periphery of the lower surface 10b of the eyelet 10 is preferably exposed from the metal base 60. When manufacturing a semiconductor package using the semiconductor package header 1, a cap may be welded to the outer periphery of the upper surface 10a of the eyelet 10. The outer periphery of the lower surface 10b of the eyelet 10 is used as a portion for receiving a tool that fixes the eyelet 10, and if the copper is present at the outer periphery of the lower surface 10b of the eyelet 10, the copper, which is soft, may become deformed during the welding of the cap.

However, when not using a cap similar to the conventional cap described above, the metal base 60 may be disposed on the outer periphery of the lower surface 10b of the eyelet 10, and the metal base 60 may protrude outside the eyelet 10 in the plan view. In these cases, it is possible to improve the heat dissipation performance of the semiconductor package header 1, because a volume of the metal base 60 increases.

In a case where the material used for the eyelet 10 is iron, the material used for the metal base 60 may be iron. In the case where the eyelet 10 and the metal base 60 are formed of the same material as described above, the thermal expansion coefficients of the eyelet 10 and the metal base 60 become the same. For this reason, deformation of the eyelet 10 and the metal base 60 caused by heat can be reduced, and it is possible to improve a hermetic seal of the semiconductor package when manufacturing the semiconductor package in which the semiconductor device is mounted on the semiconductor package header 1.

The metal base 60 may be formed integrally with the metal block 30.

Figure 4:
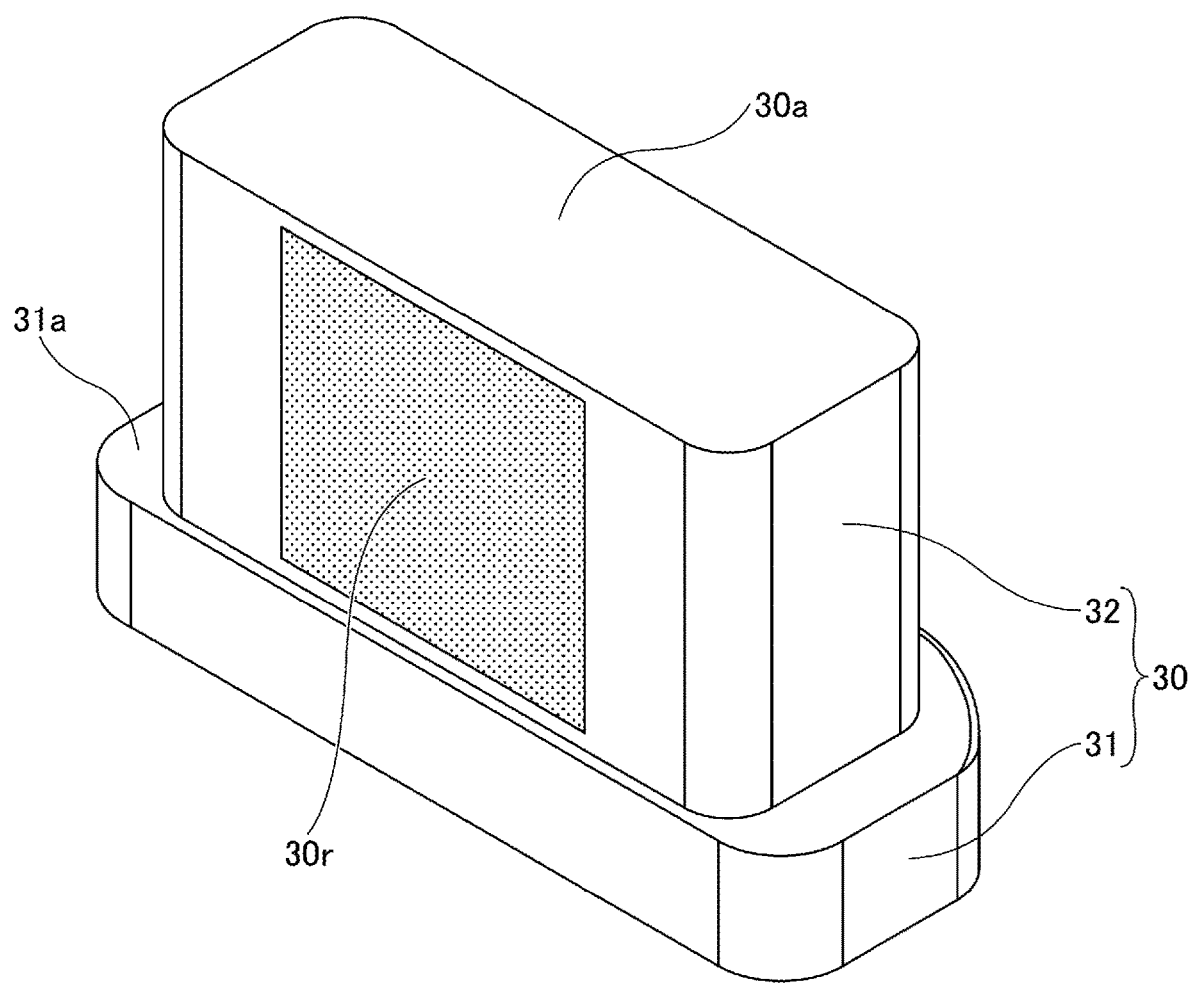
FIG. 4 is a perspective view illustrating a metal block included in the header for the semiconductor package according to the first embodiment.
Figure 5A:
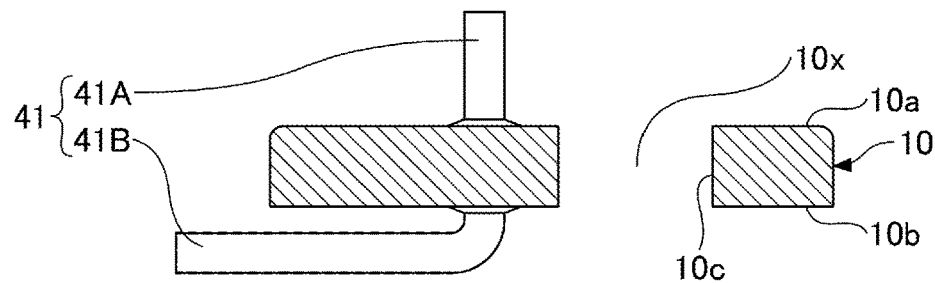
FIG. 5A, FIG. 5B, and FIG. 5C are cross sectional views illustrating the header for the semiconductor package according to the first embodiment at different manufacturing stages.
Figure 5B:
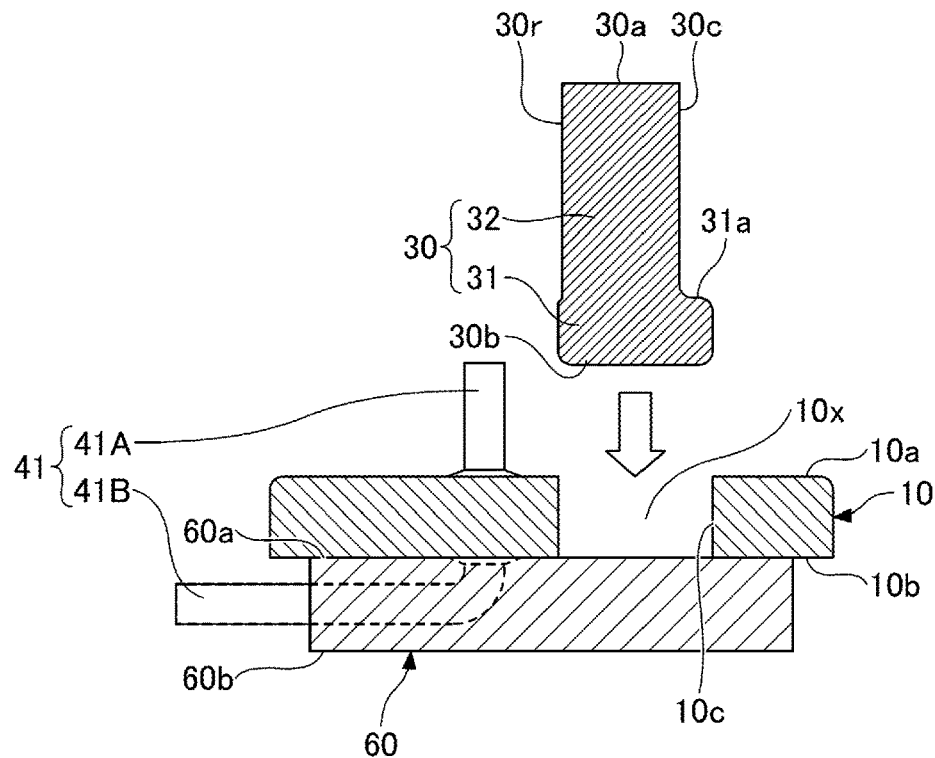
Figure 5C:
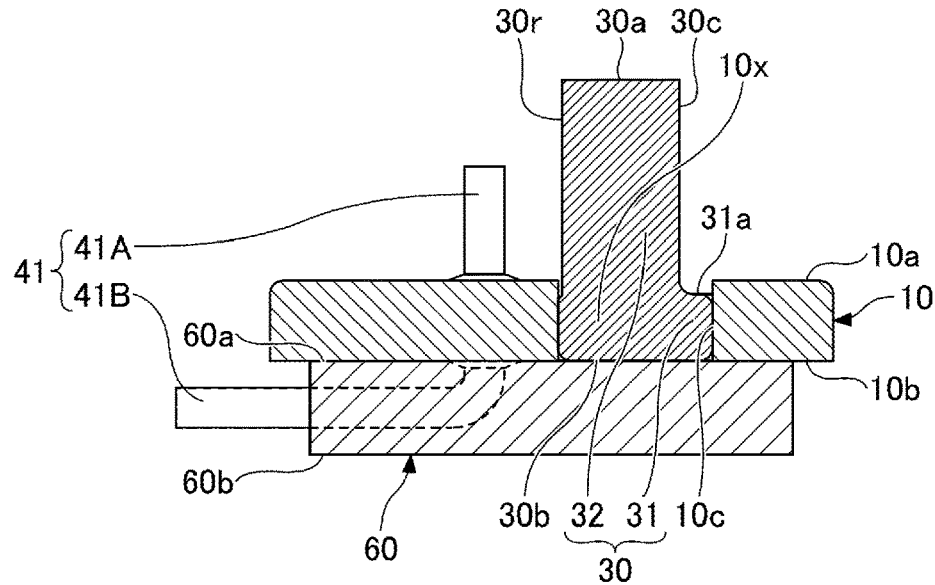

FIG. 4 illustrates the metal block included in the header for the semiconductor package according to the first embodiment, and FIG. 5A through FIG. 5C illustrate the header for the semiconductor package according to the first embodiment at different manufacturing stages.

In order to manufacture the semiconductor package header 1, first, as illustrated in FIG. 4, the metal block 30, provided with the pedestal 31, and the columnar part 32 protruding from the pedestal 31, is formed (or prepared). The metal block 30 may be formed (or prepared) by forming a rod-shaped material into a predetermined shape by a drawing process, and cutting the material having the predetermined shape by a singulating process. The singulated material becomes the pedestal 31 and the columnar part 32. Thereafter, a forming process is performed on each singulated material using a die. More particularly, with respect to each singulated material, the forming process presses a periphery of a portion of each singulated material, which becomes the columnar part 32, using the die, and a planarizing process is performed to planarize a portion of the columnar part 32, which becomes the device mounting surface 30r. Hence, the pressed portion becomes smaller than the non-pressed portion. In other words, the pressed portion becomes the columnar part 32, the non-pressed portion becomes the pedestal 31, thereby completing the shape illustrated in FIG. 4. In the plan view, the outer periphery of the pedestal 31 is exposed around the columnar part 32. In the present specification, a "flat surface" refers to a surface having a maximum flatness of approximately 0.005 mm. In FIG. 4, a flat portion of the device mounting surface 30r is indicated by a dot pattern.

Next, as illustrated in FIG. 5A, the eyelet 10, having the through hole 10x, and the through holes 10y for inserting the first lead 41 and the second lead 42, penetrating the eyelet 10 from the upper surface 10a to the lower surface 10b, is formed (or prepared) by a stamping process or the like. Then, the first lead 41 and the second lead 42, that are bent in advance to a predetermined shape, are inserted into the through holes 10y of the eyelet 10, and the peripheries of the first lead 41 and the second lead 42 are sealed by the sealer 50 inside the through holes 10y. Alternatively, the first lead 41 and the second lead 42, that are not bent, may be inserted into the through holes 10y of the eyelet 10, the peripheries of the first lead 41 and the second lead 42 may be sealed by the sealer 50 inside the through holes 10y, before bending the first lead 41 and the second lead 42 to the predetermined shape.

Next, as illustrated in FIG. 5B, a metal bonding material (not illustrated) is disposed on an upper surface 60a of the metal base 60, and further, the structure illustrated in FIG. 5A is disposed on the metal bonding material. Then, the pedestal 31 of the metal block 30 is inserted into the through hole 10x of the eyelet 10, and disposed so that at least a portion of the columnar part 32 protrudes from the upper surface 10a of the eyelet 10. The lower surface 30b of the metal block 30 makes contact with the metal bonding material.

Next, as illustrated in FIG. 5C, the metal bonding material is heated to a temperature higher than a melting point of the metal bonding material, to melt the metal bonding material and thereafter solidify the metal bonding material. In this state, the eyelet 10 and the metal block 30 may be pressed toward the metal base 60. Because the metal bonding material melts and becomes thin to a substantially uniform thickness, the lower surface 30b of the metal block 30 and the lower surface 10b of the eyelet 10 approximately coincide. In addition, a portion of the melted metal bonding material enters a gap between a side surface of the pedestal 31 (that is, a portion of a side surface 30c of the metal block 30) and an inner wall surface 10c of the through hole 10x of the eyelet 10 due to capillary action, and solidifies in a state filling this gap. Hence, the eyelet 10, the metal base 60, and the metal block 30 are bonded.

Accordingly, the lower surface 30b of the metal block 30 is bonded to the upper surface 60a of the metal base 60 by the metal bonding material, and the side surface 30c of the metal block 30 is bonded to the inner wall surface 10c of the through hole 10x of the eyelet 10 by the metal bonding material. Moreover, the lower surface 10b of the eyelet 10 is bonded to the upper surface 60a of the metal base 60 by the metal bonding material. As a result, the semiconductor package header 1 is completed.

The process of manufacturing the semiconductor package, having the semiconductor device mounted on the semiconductor package header 1, may include a heating process of heating the semiconductor package to approximately 300° C. For this reason, a material used for the metal bonding material which bonds the eyelet 10, the metal base 60, and the metal block 30, preferably has a melting point of 350° C. or higher. For example, a silver solder having a melting point of approximately 800° C. may be used for the metal bonding material.

As described above, in the semiconductor package header 1, the first lead 41 and the second lead 42 are bent at the lower surface 10b of the eyelet 10, and protrude from the side surface of the eyelet 10 in the plan view. In addition, the first lead 41 and the second lead 42, that are located at positions overlapping the eyelet 10 in the plan view, are disposed within the thickness range of the metal base 60 in the side view.

Accordingly, when disposing a heat sink, such as a heat spreader or the like, on the lower surface 60b of the metal base 60, it becomes unnecessary to form holes in the heat spreader or the like for passing through the first lead 41 and the second lead 42. As a result, the heat sink, such as the heat spreader or the like, can easily be disposed on the lower surface 10b of the eyelet 10. In addition, it is possible to improve the heat dissipation performance, because a contact area between the lower surface 60b of the metal base 60 and the heat sink, such as the heat spreader or the like, can be increased.

The semiconductor package header 1 may include a single lead, or may include three or more leads.

Figure 6:
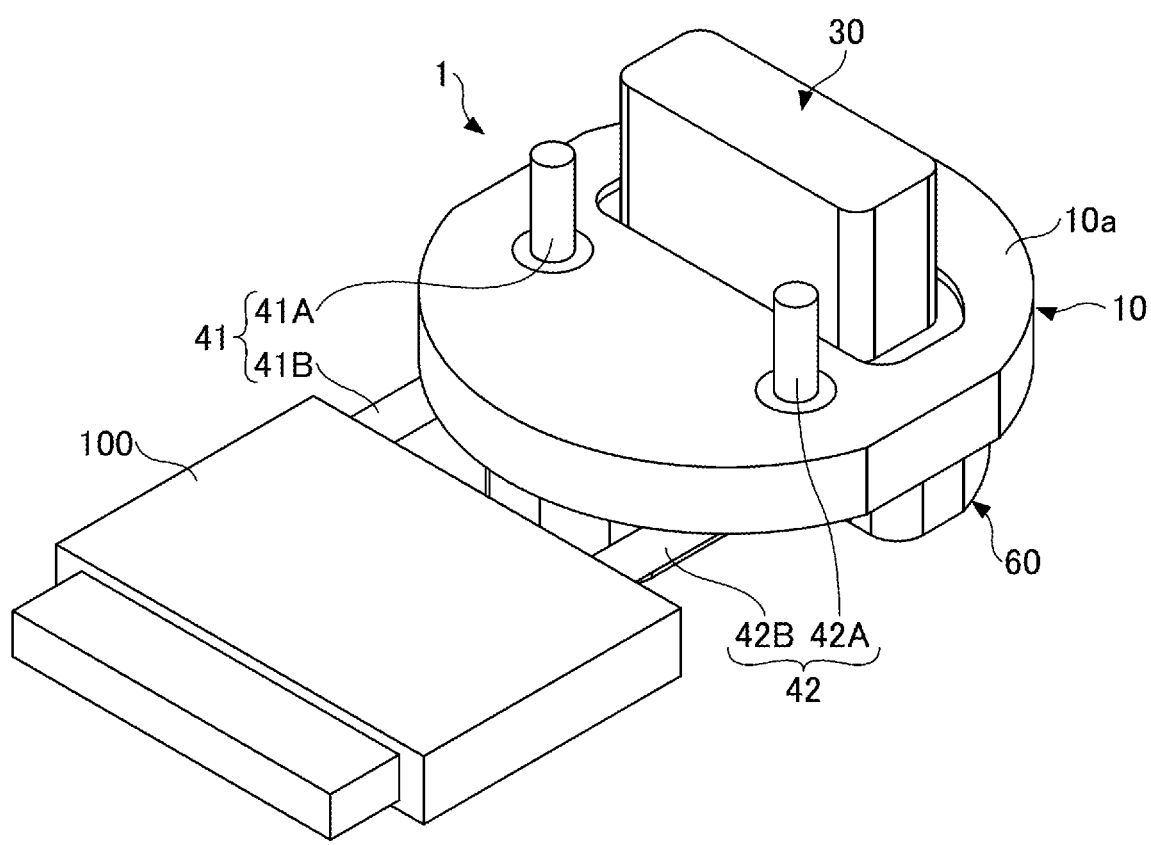
FIG. 6 is perspective view illustrating an example of a state of use of the header for the semiconductor package.

FIG. 6 is perspective view illustrating an example of a state of use of the header for the semiconductor package. The first lead 41 and the second lead 42 of the semiconductor package header 1 illustrated in FIG. 6 are inserted into a socket 100. The socket 100 can be mounted on a wiring board, for example. By connecting the semiconductor package header 1 to the socket 100, it becomes possible to easily replace the semiconductor package header 1.

In the semiconductor package header 1, the first lead 41 and the second lead 42 protrude from the side surface of the eyelet 10. Hence, tips of the first lead 41 and the second lead 42 can be visually recognized when viewing the upper surface 10a of the eyelet 10. For this reason, it is possible to easily connect the first lead 41 and the second lead 42 to the socket 100, connect the first lead 41 and the second lead 42 to wirings by solder, or the like.

Moreover, the semiconductor package header 1 has a configuration in which the metal block 30 including the pedestal 31 and the columnar part 32 protruding from the pedestal 31 is manufactured in advance, and the pedestal 31 is inserted into the through hole 10x of the eyelet 10 so that a portion of the columnar part 32 protrudes from the upper surface 10a of the eyelet 10. As a result, it is possible to obtain the semiconductor package header 1 capable of securing a sufficiently large area for the flat region of the device mounting surface 30r. In addition, it is possible to solve the problem of cracks being generated in the sealer 50. Further, as illustrated in FIG. 3, in a case where the device mounting surface 30r is formed to a position below the upper surface 10a of the eyelet 10, it is possible to secure an even larger area for the flat region of the device mounting surface 30r.

In the semiconductor package header 1, the metal base 60 having the thermal conductivity higher than or equal to that of the eyelet 10 is bonded to the lower surface 10b of the eyelet 10, so as to cover and close one end of the through hole 10x. One end (or the lower surface 30b) of the metal block 30 is inserted into the through hole 10x, and bonded to the metal base 60 inside the through hole 10x. On the other hand, the other end (or the upper surface 30a) of the metal block 30 protrudes from the upper surface 10a of the eyelet 10. Further, the lower surface 30b of the metal block 30 approximately coincides with the lower surface 10b of the eyelet 10.

According to the configuration of the semiconductor package header 1 described above, the lower surface 30b of the metal block 30 can be disposed to a position close to the metal base 60 that functions as the heat sink, when mounting the semiconductor device on the device mounting surface 30r of the metal block 30. Moreover, by inserting the metal block 30 into the through hole 10x, it is possible to increase the volume of the metal block 30. As a result, it is possible to improve the heat dissipation performance of the semiconductor package header 1.

Accordingly to each of the embodiments described above, it is possible to provide a header for a semiconductor package that enables a heat sink to be easily disposed on a lower surface of an eyelet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A header for a semiconductor package, comprising:
an eyelet having a first surface, a second surface opposite to the first surface, a side surface, and a pair of first through holes penetrating the eyelet from the first surface to the second surface;
a pair of leads inserted through the pair of first through holes, respectively; and
a metal base bonded to the second surface of the eyelet, wherein:

the pair of leads is bent at the second surface of the eyelet and protrudes in parallel in a predetermined direction from the side surface of the eyelet in a plan view,
the metal base is spaced apart from the pair of leads,
the metal base includes a portion disposed on the second surface and extending in the predetermined direction between bent portions of the pair of leads in the plan view, and
the pair of leads, located at a position overlapping the eyelet in the plan view, is disposed within a thickness range of the metal base from the second surface in a side view.

2. The header for the semiconductor package as claimed in claim 1, wherein each lead of the pair of leads includes a first part penetrating the eyelet, and a second part continuous with the first part and parallel to the second surface of the eyelet.

3. The header for the semiconductor package as claimed in claim 2, wherein an angle formed between the first part and the second part of each lead of the pair of leads is at a right angle.

4. The header for the semiconductor package as claimed in claim 2, wherein
the second part of one of the pair of leads is parallel to the second part of the other of the pair of leads.

5. The header for the semiconductor package as claimed in claim 1, wherein an outer periphery of the second surface of the eyelet is exposed around the metal base.

6. The header for the semiconductor package as claimed in claim 1, wherein
the eyelet includes a second through hole penetrating the eyelet from the first surface to the second surface,
the header further comprising:
a metal block having a first end inserted into the second through hole provided in the eyelet, and a second end opposite to the first end, and protruding from the first surface of the eyelet.

7. The header for the semiconductor package as claimed in claim 6, wherein the first end of the metal block is bonded to the metal base.

8. The header for the semiconductor package as claimed in claim 6, wherein
the metal block includes a pedestal, and a columnar part protruding from the pedestal,
the pedestal is inserted into the second through hole,
the columnar part includes a portion protruding from the first surface,
the columnar part includes a device mounting surface on which a semiconductor device is to be mounted, and
an outer periphery of the pedestal is exposed around the columnar part in the plan view.

9. The header for the semiconductor package as claimed in claim 8, wherein a portion of the device mounting surface is located inside the second through hole.

10. The header for the semiconductor package as claimed in claim 8, wherein, at the outer periphery of the pedestal exposed around the columnar part, a width of the metal block at the device mounting surface is narrower than a width of the metal block at surfaces other than the device mounting surface.

11. The header for the semiconductor package as claimed in claim 1, wherein the metal base has a thermal conductivity identical to a thermal conductivity of the eyelet.

12. The header for the semiconductor package as claimed in claim 1, wherein the metal base has a thermal conductivity higher than a thermal conductivity of the eyelet.

13. The header for the semiconductor package as claimed in claim 1, wherein the eyelet is a disk-shaped member.

* * * * *